United States Patent [19]
Schlangenotto et al.

[11] Patent Number: 5,773,858
[45] Date of Patent: Jun. 30, 1998

[54] POWER DIODE

[75] Inventors: Heinrich Schlangenotto, Neu-Isenburg; Karl-Heinz Sommer; Franz Kaussen, both of Warstein, all of Germany

[73] Assignee: Eupec Europaeische Gesellschaft fuer Leistungshalbleiter mbH & Co. KG., Warstein-Belecke, Germany

[21] Appl. No.: 5,760

[22] Filed: Jan. 19, 1993

[30] Foreign Application Priority Data

Jan. 17, 1992 [DE] Germany ............................ 42 01 183.3

[51] Int. Cl.⁶ .................................................. H01L 23/58
[52] U.S. Cl. ......................... 257/212; 257/594; 257/653; 257/654; 257/657
[58] Field of Search ................................. 257/212, 594, 257/653, 654, 922, 657, 611

[56] References Cited

U.S. PATENT DOCUMENTS 4,587,547  5/1986  Amemiya et al. .
5,063,428  11/1991  Schlaugenotto et al. .

FOREIGN PATENT DOCUMENTS 1232974   2/1988   Canada .
0090722  10/1983   European Pat. Off. .
0103138   3/1984   European Pat. Off. .
0450306  10/1991   European Pat. Off. .
3631136   3/1988   Germany .
3633161   7/1991   Germany .

*Primary Examiner*—Tom Thomas
*Assistant Examiner*—David B. Hardy
*Attorney, Agent, or Firm*—Herbert L. Lerner; Laurence A. Greenberg

[57] ABSTRACT

A power diode includes at least one semiconductor body having an inner zone of a first conductivity type and a given doping level, a cathode zone of the first conductivity type and a doping level higher than the given doping level, and an anode zone of a second conductivity type opposite the first conductivity type and a doping level higher than the given doping level. The inner zone has at least a first region with a first predetermined thickness being dimensioned for a required blocking voltage and a second region with a second thickness being greater than the first predetermined thickness by at least a factor of 1.4. The area and/or the minority carrier life of first and second partial diodes is dimensioned for causing a current flowing through the first partial diode in a conductive phase to be greater than a current flowing through the second partial diode by at least a factor of 2.

14 Claims, 7 Drawing Sheets

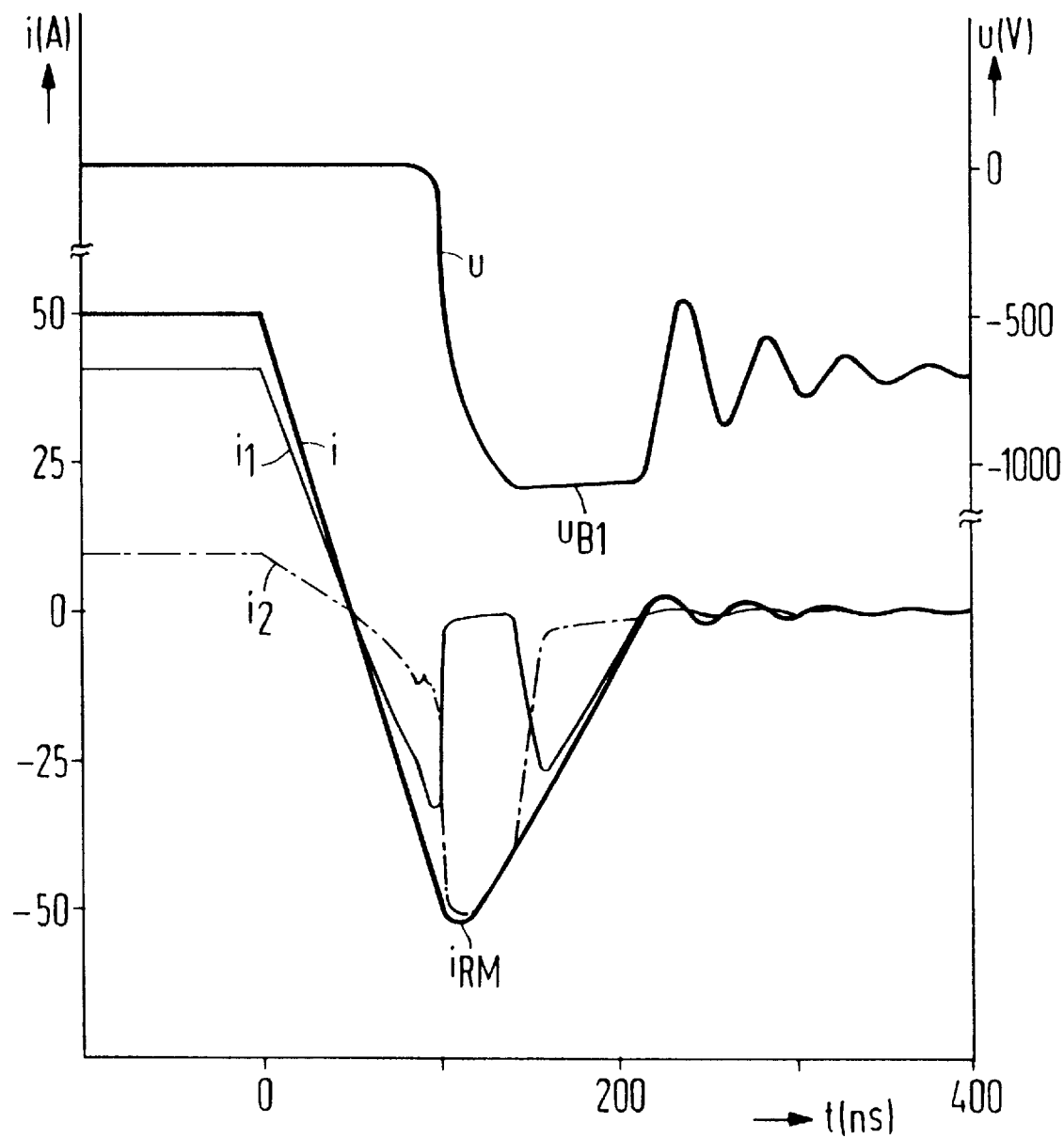

POWER DIODE

SPECIFICATION

The invention relates to a power diode including at least one semiconductor body having an inner zone of a first conductivity type and given doping level, a cathode zone of the first conductivity type and a higher doping than the inner zone, and an anode zone of an opposite second conductivity type and a higher doping than the inner zone, the inner zone having at least first and second regions, the first region having a first predetermined thickness and the second region having a second, greater thickness.

Such a power diode has been described, for instance, in U.S. Pat. No. 4,587,547.

Rectifier diodes for power electronics have a PNN$^+$ doping structure and accordingly include a weakly doped inner zone located in the middle which generally is of N conductivity, and two higher-doped zones of P or N conductivity type adjoining the middle zone on the outside. High-speed diodes are also doped with recombination centers such as gold and platinum, or lattice defects are produced by electron or gamma irradiation, in order to lower the charge carrier life and thereby improve the dynamic properties. With high-speed power diodes, the demand above all is that in commutation out of the conducting state, the maximum reverse current should be low and the drop in reverse current after the maximum return current should not be overly steep (this is known as soft recovery performance). The voltage drop in the conducting state and the blocking current must not exceed certain values.

A known method for making the recovery performance soft to a certain degree includes setting the base zone substantially thicker than is necessary for the desired blocking capacity. As a result, at the instant of the peak reverse current and of the ensuing maximum in the back or return voltage, enough charge carriers are still present in the structure to avert an interruption in the reverse current. Nevertheless, the degree of the soft recovery performance thus attained is still relatively low. However, an at least equally great disadvantage of that method is that increasing the base thickness greatly increases the maximum reverse current $i_{RM}$, if the conducting voltage $U_F$ is to remain unchanged, or that a higher $U_F$ value results if $i_{RM}$ is to remain unchanged. Neither of those methods is desirable.

It is also known that a softer recovery performance and at the same time a lower reverse current peak can be attained by reducing the integral doping of the P-zone, which is typically on the order of magnitude of $10^{16}/cm^2$, to a lower limit of approximately $1*10^{13}/cm^2$. Advantageously, highly doped P$^+$ islands are introduced into the P zone, to keep the conducting voltage low at high currents, as is seen in German Published, Non-Prosecuted Application DE 36 33 161 A, corresponding to U.S. Pat. No. 5,063,428. In that method as well, the base thickness must be selected to be greater than is necessary for the blocking capacity sought, because otherwise the storage charge would be exhausted prematurely and the reverse current would undergo a hard break or interruption. Once again, increasing the base thickness involves an increase in the reverse current peak or in $U_F$.

In order to improve the recovery performance of power diodes, Published European Application No. 0 090 722 A describes a semiconductor structure in which an N zone of medium doping concentration, that is in the range of from $10^{14}$ to $10^{16}$ per cm$^3$, is disposed between the weakly doped n-conducting base zone and the highly doped N$^+$ region.

Once again, a relatively low reverse current peak and a soft recovery performance can be attained as a result. However, producing such a structure requires a two-stage epitaxial process, which involves high costs for relatively high-blocking diodes. Moreover, the recovery performance is still not as good as is desired for many applications.

A disadvantage of the known diodes is also that as a rule they lose their capacity to function if the voltage during fast commutation enters the vicinity of the breakdown voltage. High-frequency oscillation and electromagnetic interference also threaten other components in the circuit.

It is accordingly an object of the invention to provide a power diode, which overcomes the hereinafore-mentioned disadvantages of the heretofore-known devices of this general type and which has a further improved recovery performance. In particular, the maximum reverse current should be reduced beyond the extent previously achieved, without impairing the soft recovery performance. Moreover, destruction of the components if the voltage during commutation enters the breakdown range should be prevented. That is, breakdown resistance or avalanche resistance should be attained.

With the foregoing and other objects in view there is provided, in accordance with the invention, a power diode, comprising at least one semiconductor body having an inner zone of a first conductivity type and a given doping or dopant level, a cathode zone of the first conductivity type and a doping level higher than the given doping level, and an anode zone of a second conductivity type opposite the first conductivity type and a doping level higher than the given doping level; the inner zone having at least a first region with a first predetermined thickness being dimensioned for a required blocking voltage and a second region with a second thickness being greater than the first predetermined thickness by at least a factor of 1.4; and first and second partial diodes each including a respective one of the first and second regions and having an area and a minority carrier life, the area and/or the minority carrier life having dimensions causing a current flowing through the first partial diode in a conductive phase to be greater than a current flowing through the second partial diode by at least a factor of 2.

In accordance with another feature of the invention, the inner regions of the two partial diodes have equal doping concentrations.

In accordance with a further feature of the invention, the inner region of the second partial diode has a greater doping concentration than the inner region of the first partial diode.

In accordance with an added feature of the invention, the partial diodes have dimensions causing the second partial diode to have a storage charge in a conducting direction corresponding to from 0.5 to 2 times a storage charge of the first partial diode in the conducting direction.

In accordance with an additional feature of the invention, the partial diodes have equal storage charges in a conducting direction.

In accordance with yet another feature of the invention, the partial diodes have effective base thicknesses and dimensions causing conducting currents thereof to vary approximately inversely proportionally to the square of the effective base thicknesses.

In accordance with yet a further feature of the invention, the partial diodes have areas being adapted to one another causing conducting current densities thereof to be at least approximately equal.

In accordance with yet an added feature of the invention, the first partial diode has an area of from 3 to 15 times greater than the area of the second partial diode.

In accordance with yet an additional feature of the invention, the second region is approximately twice as thick as the first region.

In accordance with again another feature of the invention, the partial diodes have dimensions causing a conducting current flowing through the second partial diode to be from one-fourth to one-eighth of a conducting current flowing through the first partial diode.

In accordance with again a further feature of the invention, the anode zone has first and second anode regions, the first and second partial diodes each include a respective one of the first and second anode regions, and the anode region of the second partial diode is more weakly doped than the anode region of the first partial diode.

In accordance with again an added feature of the invention, the partial diodes are integrated into the semiconductor body.

In accordance with again an additional feature of the invention, the at least one semiconductor body includes separate semiconductor bodies for the partial diodes, and the partial diodes have electrically interconnected cathode electrodes and electrically interconnected anode electrodes.

In accordance with a concomitant feature of the invention, there is provided an inductive resistor connected between the anode electrodes of the partial diodes.

Other features which are considered as characteristic for the invention are set forth in the appended claims.

Although the invention is illustrated and described herein as embodied in a power diode, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 7 is a diagram used to explain the commutation process if a breakdown voltage is attained in a partial diode;

Figure 1:
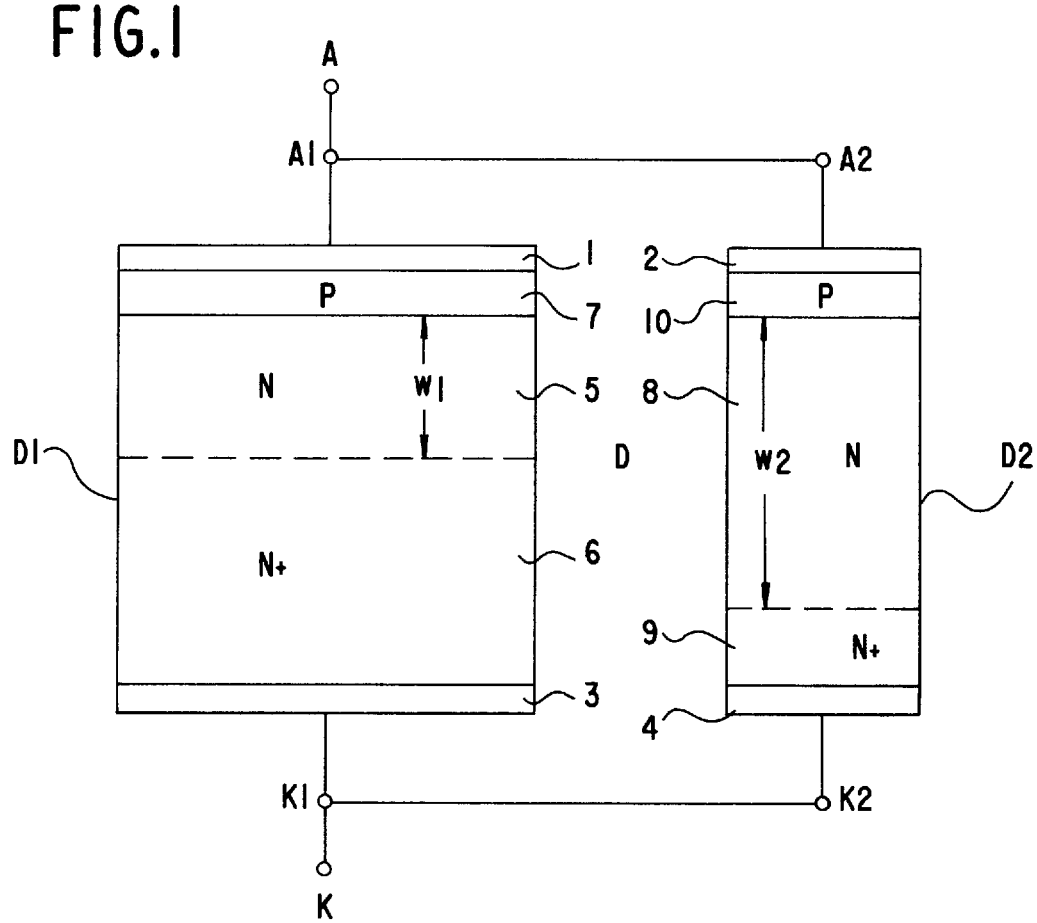
FIG. 1 is a diagrammatic and schematic view illustrating the principle of the invention.

Referring now to the figures of the drawing in detail and first, particularly, to FIG. 1 thereof, in order to explain the principle of the invention there is seen a diode unit D that is subdivided into first and second partial diodes D1, D2, both of which have a PNN$^+$ zone sequence. A first N-doped inner zone 5 of the partial diode D1 has a slight thickness $w_1$, while a second inner zone 8 of the partial diode D2 has a greater thickness $w_2$. N$^+$ cathode zones 6, 9 of the partial diodes are provided with metal layers or cathode electrodes 3, 4 for resistive contacting. These layers 3, 4 are connected to cathode terminals K1 and K2 that lead to a cathode K of the diode unit. P anode zones 7, 10 are likewise resistively provided with metal layers 1, 2, which are joined to anode terminals A1 and A2 of the respective partial diodes D1 and D2 and which are in contact with an anode terminal A of the diode unit by way of the anode terminals. The doping concentration is assumed to be equal in corresponding zones of both partial diodes. As in conventional diodes, the doping concentration of the P zones is preferably set substantially lower than that of the N$^+$ zone, for instance with an integral doping concentration of $5*10^{12}/cm^2$ to $1*10^{14}/cm^2$, in order to obtain soft recovery performance by he diode unit. In order to improve the conducting performance at high currents, highly doped P$^+$ regions can be incorporated into the P zone, as has already been proposed by German Published, Non-Prosecuted Application DE 36 33 161 A, corresponding to U.S. Pat. No. 5,063,428, for instance.

The fact that substantial improvements can be attained by such a diode is based on the following discovery: a total storage charge $Q_F$ that is stored in the diode in the conductive phase can be decreased sharply as compared with a known diode of the same conducting voltage. This is transferred to a charge $Q_r$ extracted by reverse current, which except for a recombination component is jointly determined by the charge $Q_F$.

The reduced charge $Q_r$ can equally advantageously be distributed to a storage charge $Q_{rf}$ extracted after a reverse current peak during the dropping phase and a charge $Q_{rs}$ extracted until the reverse current peak, so that a so-called soft factor $S=t_f/t_s=Q_{rf}/Q_{rs}$ ($t_f$=dropping time, $t_s$=storage time) of the diode unit is equal to that of an optimized single diode that serves the purpose of comparison. The diode unit according to the invention thus has a substantially lower reverse current than the reference diode for the same conducting, blocking and soft recovery performance.

This will now be described in greater detail together with the necessary dimensioning. The storage charge $Q_F$ of a diode in the conducting phase is defined approximately by the following equation:

$$Q_F = \frac{i_F W^2}{(\mu_n + \mu_p)U_{ohm}} \qquad 1)$$

In this case, $\mu_n$ and $\mu_p$ designate the mobilities of the electrons or holes, $i_F$ is the conducting current, $U_{ohm}$ stands for the ohmic voltage drop, and W is the thickness of the middle region (effective base region) flooded by charge carriers. Since this middle region includes not only the base zone but also adjacent regions of the end regions, if the minority carrier concentration there with diffused end regions is greater than the doping concentration, then the effective base thickness W is generally greater than the actual base thickness w. Equation 1) applies to the diode unit for each of the partial diodes having conducting currents which are designated as $i_{F1}$, $i_{F2}$ and having storage charges that are designated as $Q_{F1}$, $Q_{F2}$. In the case of the storage charge $Q_F = Q_{F1}+Q_{F2}$ of the diode unit having the conducting current $i_F=i_{F1}+i_{F2}$ it thus follows from equation 1 that:

$$Q_F = \left( \frac{i_{F1}}{i_F} \left( \frac{W_1}{W_2} \right)^2 + \frac{i_{F2}}{i_F} \right) Q_{F0} \qquad 2)$$

where $Q_{F0}=i_F W^2_2 /((\mu_n+\mu_p)U_{ohm})$. The base thickness of the partial zone D2, which is intended to assure the soft performance, is selected to be equal to the base thickness of a diode with soft recovery performance. $Q_{F0}$ therefore means the storage charge of this comparison diode, which differs from D2 only in that at the ohmic voltage drop $U_{ohm}$ of the partial diodes for the partial currents, it carries the total current $i_F$. Since the conducting voltage of the partial diodes and the reference diode is the same, the ohmic voltage component $U_{ohm}$ is accordingly allowed to be set to be equal as well, to a good approximation.

In a diode with soft recovery performance, the base thickness $w_2$ must be selected to be equal to at least 1.4 times a minimum base thickness $w_{min}$ for the required blocking capacity, if a hard reverse current drop is to be avoided. A ratio of 2 is often optimal. If $w_{min}$ is made as small as possible (close to pin diode voltage drop), by reducing the doping concentration of the base region, then $w_2/w_{min}$ should be set even greater than 2. The ratio of the effective base thickness $W_2/W_1$ of the partial diodes can also therefore be selected as an optimum of at least 2. In the exemplary embodiment described below for a 1000 V diode (see FIG. 5), $W_2/W_1$ is equal to 2.9. If $W_2/W_1=2$, then from equation 2), for the storage charge $Q_F$ of the diode unit, depending on the current distribution to the two partial diodes, a value between $Q_{F0}/4$ and $Q_{F0}$ is obtained. If $i_{F1}=0.8\ i_F$, and $i_{F2}=0.2\ i_F$, then $Q_F=0.4\ Q_{F0}$.

Figure 2:
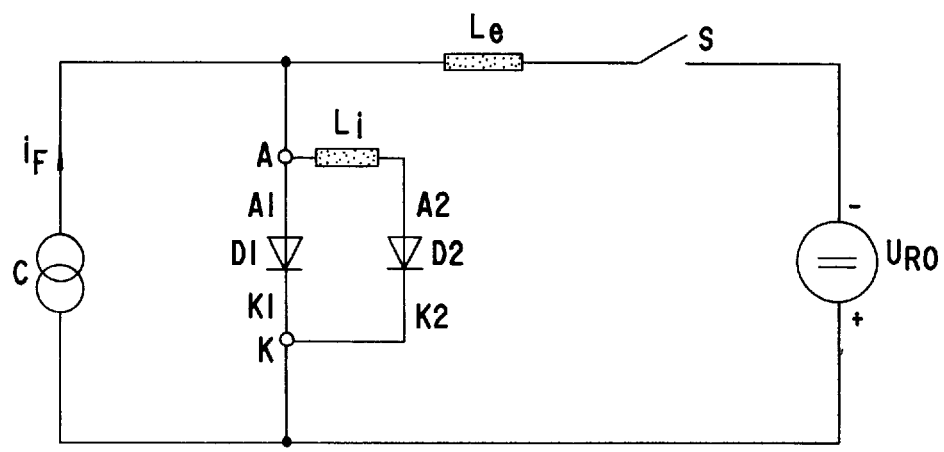
FIG. 2 is a schematic circuit configuration used to explain a commutation process in a diode according to the invention.

The way in which the current and the storage charge are to be distributed to the two partial diodes so that good recovery performance is obtained, will now be explained. First, the commutation process of the diode according to the invention will be explained in general. To this end, reference will be made to the circuit shown in FIG. 2. A conducting current $i_F$ flows from a current source C. By closure of a switch S, a commutation voltage $U_{R0}$ that is oriented backward is applied to the diode unit, which is in series with an external leakage inductance $L_e$. A leakage inductance $L_i$ may also be located inside the diode unit D before the partial diode D2, as will be explained later.

Figure 3:
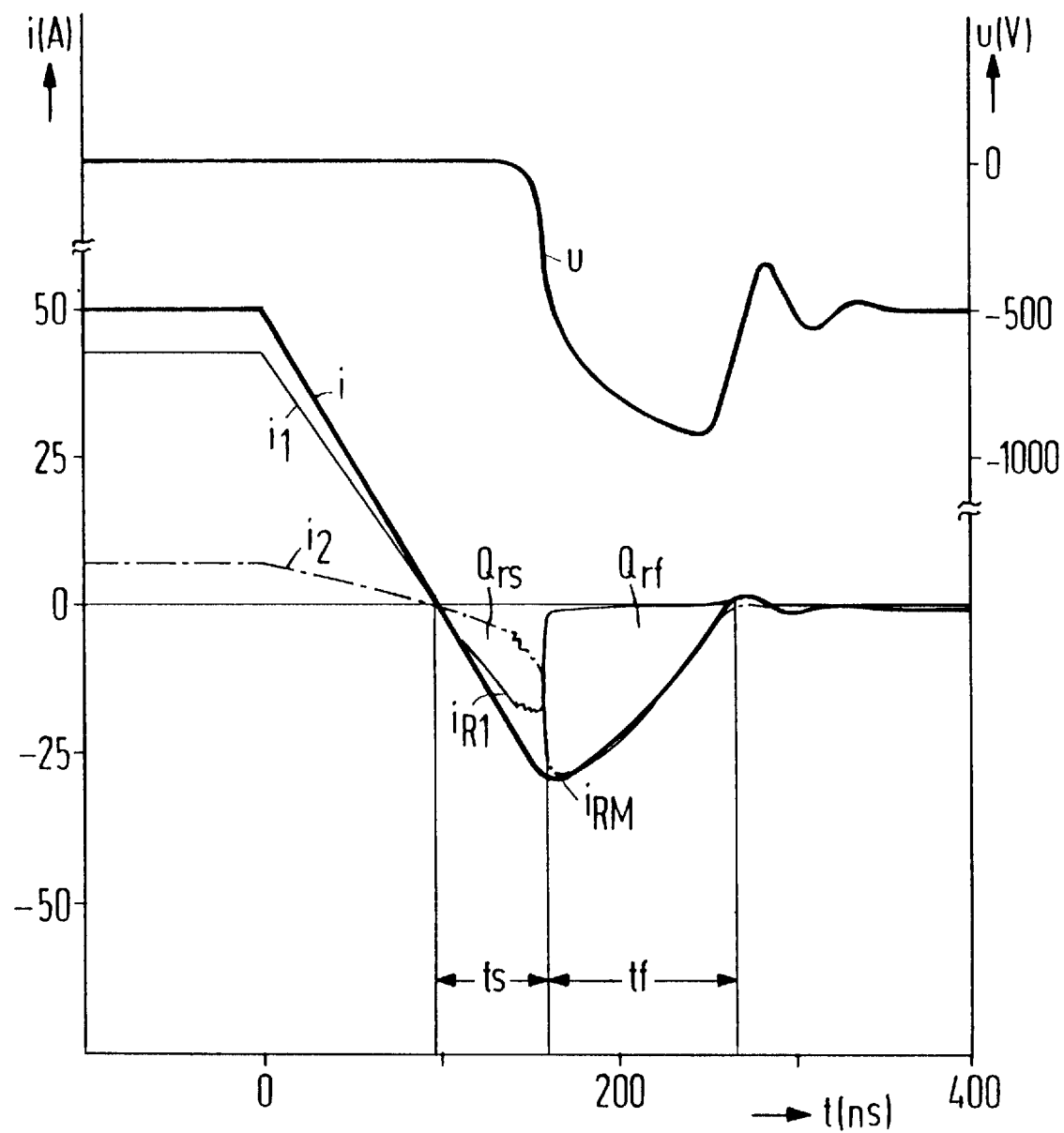
FIG. 3 is a diagram used to explain the commutation process.

The courses over time of the currents and the voltage that occur in such a commutation are shown in FIG. 3. In this case, a diode with a blocking voltage of 1100 V and a rated current of 50 A was assumed. The total current is i; $i_1$ and $i_2$ are currents through the partial diodes; and U is the voltage that is located at the diode or in other words at the partial diodes as well. A conducting current of 50 A first flows, 85% of it through the partial diode D1 having the thin base zone, and 15% of it through the partial diode D2 having the thick base zone. At a time t=0, the switch S is closed and the current is commutated to the blocking direction with a rise $-di/dt=U_{R0}/L_e=500$ A/μs, by means of the voltage $U_{R0}=500$ V. The internal inductance $L_i$ was left out in this case. After the zero crossover of the current, a high reverse current flows, as long as there is a storage charge in the partial diodes. Due to the thin base zone of the partial diode D1, the storage charge from this diode is already largely eliminated at a reverse voltage of approximately 200 V. The reverse current $i_{R1}$ from this diode therefore breaks or interrupts soon and also only attains a low peak value. The extracted charge $Q_{fr1}=i_{R1}$ dt is substantially less than the storage charge $Q_{F1}$ in the conducting phase, since the minority carrier life in the diode D1 must be set to be quite short, so that given the small base thickness, a much greater difference in the currents $i_{F1}$ and $i_{F2}$ will not result.

In contrast, in the diode D2 a large proportion of its initial storage charge $Q_{F2}$ will still be contained at the instant that the current of the diode D1 breaks or interrupts, because of the greater thickness. As can be seen from FIG. 3, the total reverse current of the diode unit is therefore rapidly taken on by this partial diode D2, because of a pronounced voltage rise. Since this diode carried only a relatively small conducting current, its storage charge is comparable to the storage charge $Q_{F1}$ of the partial diode D1, despite the greater base thickness (see equation 2)). The maximum reverse current of the diode unit is therefore greatly reduced as compared with a conventional soft recovery diode. This is the case even though the partial diode D2 prior to the maximum reverse current has a very high on-state current rise $|di_2/dt|$. However, the total diode unit D adopts the soft recovery performance from the partial diode D2, as FIG. 3 also shows.

At the time of a reverse current peak $i_R=i_{RM}$, the back voltage $U_R=U_{R0}$ is applied to both partial diodes, since the voltage at the inductance $L_e$ disappears. The reverse current integral $Q_{rs}=\int i_R$ dt up to this time is made up in part of the full reverse current integral $Q_{r1}=\int i_{R1}dt=a\ Q_{F1}$ of the diode D1, and the factor a<1 takes the recombination loss into account. $Q_{rs}$ also contains a component e $Q_{F2}$ already extracted from the partial diode D2. The factor e corresponds to the length of the space charge zone at the voltage $U_{R0}$ in proportion to the total effective base thickness $W_2$. Therefore, $$3)\ Q_{rs}=a\ Q_{F1}+e\ Q_{F2}$$

In contrast, in the case of the reverse current integral $Q_{rf}$ across the drop phase after the maximum reverse current, the residual storage charge (1−e) $Q_{F2}$ of the diode D2 is available:

$$4)\ Q_{rf}=(1-e)\ Q_{F2}$$

Since a soft reverse current drop and a low reverse current peak are approximately equally important for the recovery performance, it is possible to set $Q_{rf}=Q_{rs}$ as a condition for optimal recovery. Using equations 3) and 4), the following condition is obtained for the charges of the two partial diodes that are stored in the conductive phase:

$$Q_{F2} = \frac{a}{(1-2e)}\ Q_{F1} \qquad 5)$$

In this equation, a and e have respective typical values for the partial diodes in the range of 0.4±0.15 and 0.3±0.15. It is seen from equation 5) that the storage charges of the two diodes in the conducting state are preferentially set to be approximately equal. However, markedly improved recovery properties of the diode unit are obtained over the entire range 0.5 $Q_{F1}<Q_{F2}<2Q_{F1}$ as well.

In order to set $Q_F$ equal in both partial diodes, the conducting currents $i_{F1}$ and $i_{F2}$ of the two partial diodes must vary with respect to one another, in accordance with equation 1), approximately inversely proportionally to the square of their thicknesses:

$$6)\ i_{F2}/i_{F1}\approx(W_1/W_2)^2.$$

If $W_1/W_2=\frac{1}{2}$, it follows that the partial diode D2 should carry only approximately ¼ the current of the diode D1. However, other values may also be suitable depending on the ratio $W_1/W_2$ and the values for a and for e in equation 5). Usually the optimal value of $i_{F2}/i_{F1}$ is between ¼ and ⅛.

For a given doping structure, these currents can be adjusted by means of the area and the minority carrier life of each of the partial diodes. Since there are accordingly two parameters for adjusting one variable, namely the current, there is initially one degree of freedom freely available. However, the area and the life are a factor not only in the current and therefore the storage charge of the diode. They are also a factor in the variables a and e, which according to equations 3) and 4) jointly determine the storage charge $Q_{rs}$ extracted until the reverse current peak and the following charge $Q_{rf}$. The factor e, in other words the proportion of the storage charge of the diode D2 that has been eliminated by the time of the reverse current peak, can be made small by selecting the area $A_2$ of this diode to be small, which must be coupled with keeping the current and the conducting voltage constant and increasing the life. Due to the small area a high current density pertains in the diode D2 during the reverse current phase, and this causes a correspondingly high space charge through the holes and electrons. This can also be seen in the exemplary embodiment shown in FIG. 5. Until the reverse current peak at the voltage $U_R=U_{R0}$ the partial diode D2 is therefore first cleared out to a lesser width than if the area were greater and the reverse current density were less. This leads to a lessening of the reverse current peak. Since the storage charge from D2 also is available to a greater extent for the drop phase after the reverse current peak, in accordance with equation 4), the recovery performance becomes additionally softer because of the reduction in $A_2$.

However, this option for improvement is applicable only to a limited extent because the increased space charge in the vicinity of the reverse current peak and back voltage peak results in an increased field intensity. The resultant collision ionization and avalanche development must not be allowed to lead to a breakdown during the commutation or to increase the reverse current to such an extent that the positive effect is overcompensated for. It has been found that as a rule the area $A_2$ can be made so small that the conducting current density $i_{F2}/A_2$ is a maximum of approximately 300 A/cm². However, the current density in the vicinity of the maximum reverse current of the partial diode D2 is higher than this by a multiple in the case of fast commutations (see FIG. 3).

In contrast, in the partial diode D1, a large area has a favorable effect on the reverse recovery performance of the entire diode. Since the current and the voltage in the conducting state are specified, if the area $A_1$ is increased, the minority carrier life in D1 must be decreased. Due to increased recombination, the extracted charge $Q_{r1}=a\,Q_{F1}$ is therefore decreased. Thus the charge $Q_{rs}$ extracted in the storage phase becomes equal to a $Q_{F1}+eQ_{F2}$, and thus the maximum return current becomes less as the area $A_1$ increases and the area $A_2$ decreases. An upper limit for $A_1$ is the result not only of the costs but also of the fact that decreasing the life below a certain value also involves disadvantages. These disadvantages are an increased steady-state blocking current at high temperature, and the fact that the high number of recombination centers can greatly increase the space charge and thus reduce the blocking capacity.

It is often practical to select the area $A_1$ of the partial diode having the high conducting current as large enough, and the area $A_2$ of the partial diode having the low conducting current as small enough, to ensure that the conducting current densities in the two diodes are approximately equal. Due to equation 1), this means that the areas of the two partial diodes are preferentially selected in accordance with the following equation:

7) $A_2/A_1 \approx i_{F2}/i_{F1} \approx (W_1/W_2)^2$ in practical terms, the area of the diode D2 will usually be in the range of from ⅓ to ¹⁄₁₅ of $F_1$.

In order to adjust the currents and the areas of the two partial diodes as indicated, or in other words in order to make the conducting current density in the partial diode D2 as high as in the partial diode D1, the minority carrier life in the diode D2 in typical cases should be selected as approximately one order of magnitude higher than in the diode D1. The recombination loss of storage charge can therefore generally be considered negligible (a=1) for the diode D2, as was the case mentioned above.

Figure 4:
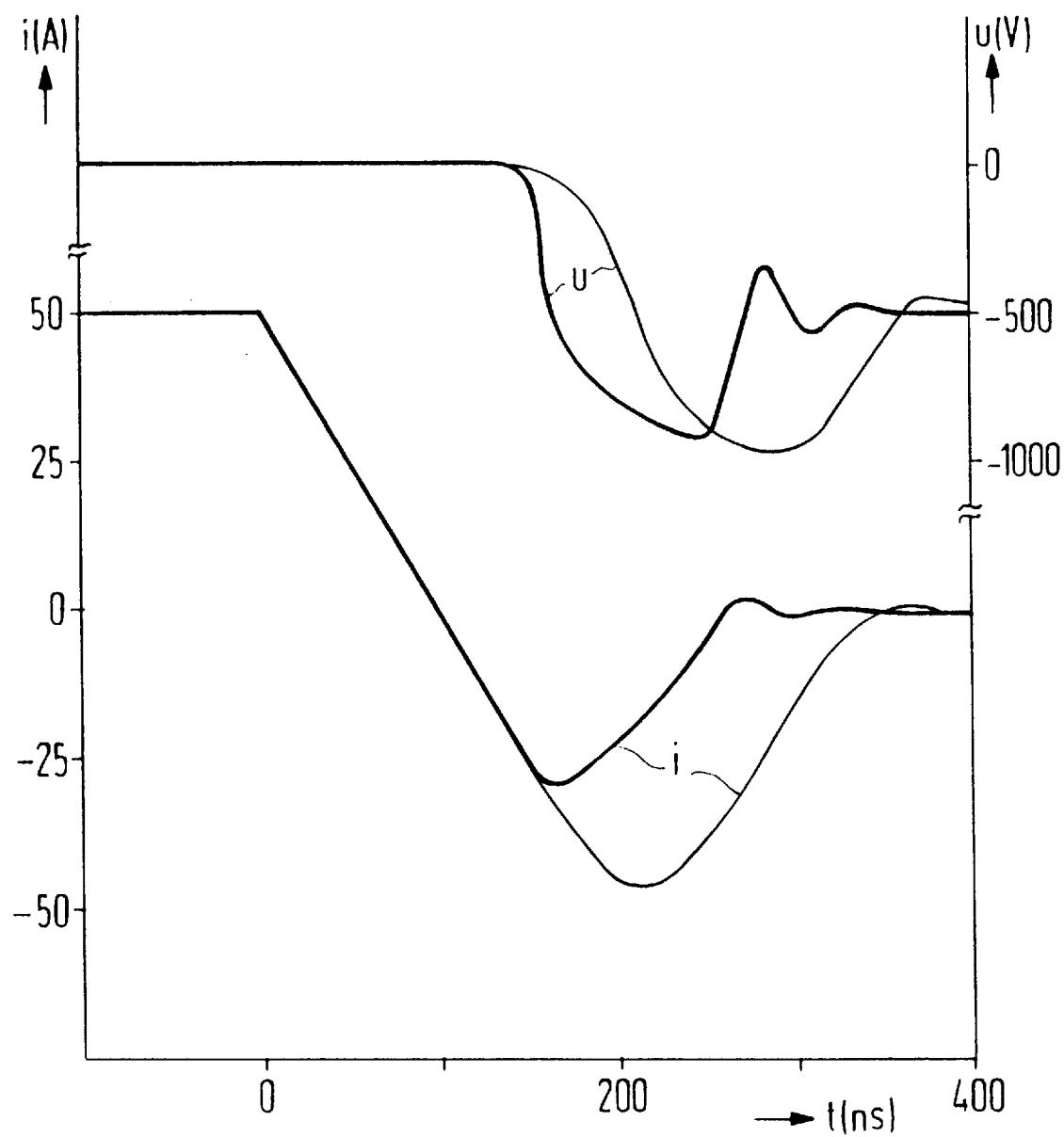
FIG. 4 is a diagram showing a comparison of the commutation process in diodes according to the prior art and according to the invention.

The improvements obtained in the recovery performance are illustrated in FIG. 4, where the course of the current and voltage upon commutation of the diode according to the invention (shown in heavy lines) are compared with those of a known diode (shown in fine lines). The maximum reverse current is reduced to nearly half that of the known diode. The maximum voltage, which is composed of the loop or circulating voltage $U_{R0}$ and the voltage induced at the inductance $L_e$ at the point of maximum rise of on-state current, has remained virtually unchanged.

As was already indicated, it is practical to select the doping concentration $N_{D1}$ of the thinner base as lower than the base doping $N_{D2}$ of the diode D2. $N_{D1}$ should be markedly less than a maximum allowable value $N_{Dmax}$ for the particular blocking capacity, while the doping concentration of the thicker base should come close to this value. In the partial diode D1, the local distribution of the electrical field at voltages in the vicinity of the blocking capacity then take the form of a trapezoid that approximates the rectangle. As a result, the minimum thickness required for the blocking capacity becomes as small as possible. In contrast, the higher base doping of the partial diode D2 prevents the space charge zone in the diode D2 from advancing unnecessarily far. As a result, the residual charge that still exists at the times of the maximum reverse current and the maximum back voltage in the base of the diode D2, is made as large as possible without increasing $w_2$. As compared with the case of equal base doping of the two partial diodes, a considerable reduction in the maximum reverse current $i_{RM}$ of the entire diode is attained, with the same soft factor. For reasons that have to do with surface passivation, it is not possible to arbitrarily approach the case where $N_{D1}=0$ and $N_{D2}=N_{Dmax}$. Preferred values in practical terms are $N_{D1}=0.2$ to 0.5 $N_{D1max}$, and $N_{D2}=0.6$ to 0.9 $N_{D2max}$.

The P zones of the two partial diodes have been assumed to be identically and relatively weakly doped, as was explained in conjunction with FIG. 1. The recovery performance can be improved even further in comparison, by weakly doping only the P zone of the diode D2, but doping the p-conducting zone of the diode D1 highly. The surface concentration of this zone is $2*10^{19}$/cm³, for instance, and the integral doping is $1*10^{16}$/cm². In contrast, the P-conducting zone of the partial diode D2 has a doping concentration at the surface of $2*10^{16}$/cm³, for instance, and the integral doping concentration is preferably in the range of from $5*10^{12}$/cm² to $10^{14}$/cm². Due to the high doping of the P-conducting zone of the partial diode D1, the minority carrier life in the diode D1 should be selected as being even shorter than in the case of FIG. 1, so that the conducting voltage at the selected currents $i_{F1}$, $i_{F2}$ becomes precisely as high as for the diode having the thicker base and the weak doping of the P zone. Due to the very short life in the diode D1, a still greater proportion of the storage charge $Q_{F1}$ will be extracted from the reverse current by recombination. As the factor a decreases, the charge $Q_{rs}$ is extracted until the reverse current peak becomes $aQ_{F1}+eQ_{F2}$, and thus the reverse current maximum $i_{RM}$ is reduced as well. If shortening the life is not suitable, because of the disadvantages mentioned, then the area $A_1$ can be reduced in size as compared with the case of low p doping of the diode D1.

However, one advantage of the equal doping of the p-doped anode zones, that was explained in conjunction with FIG. 1, is that the conducting characteristic of the diode D1, because of the low p doping, is less dependent on the life and therefore upon the temperature. The distribution of the total conducting current to the two partial diodes is accordingly less temperature-dependent as well, and therefore the recovery performance of the diode unit is near the optimum for a wide temperature range, given suitable adjustment.

Figure 5:
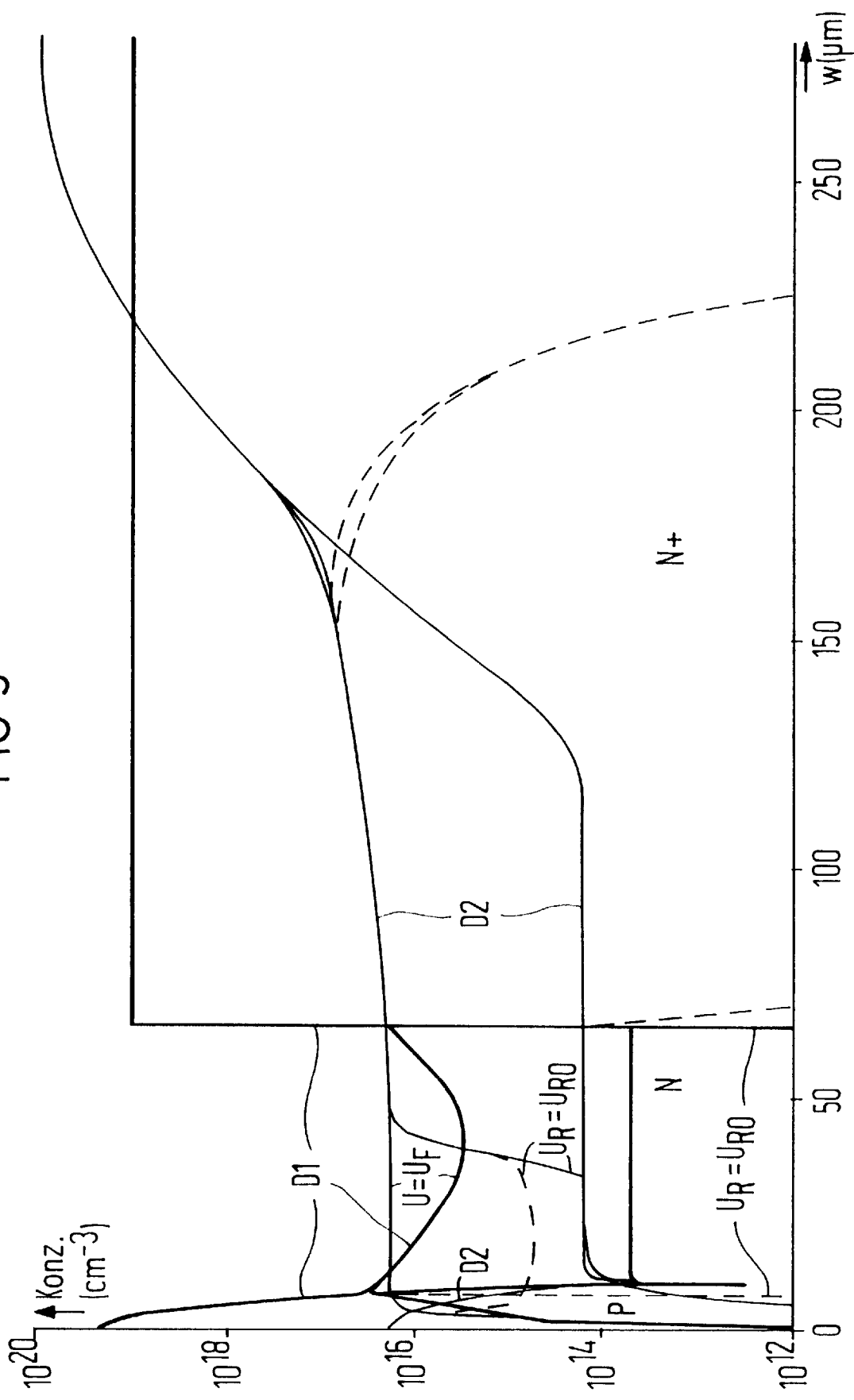
FIG. 5 is a diagram showing doping and charge carrier concentrations in an exemplary embodiment.

A diagram showing doping and charge carrier concentrations, is provided in FIG. 5 for the case of a diode having a higher doping of the anode zone of the diode D2 as compared with the anode zone of the diode D1. The doping concentration and the charge carrier concentrations are shown in the conducting phase and at the time of the maximum reverse current for both partial diodes. The doping structure is constructed for an operationally usable blocking capacity of 1000 V. For the diode D1, the base doping, at $N_D=5*10^{13}/cm^3$, is markedly less than for the diode D2, at $1.5*10^{14}/cm^3$. The base thicknesses are in a ratio of 1:2.2 to one another. The diode D1 has a high P zone doping, while the diode D2 has a P zone doping that is less by three powers of 10. The NN$^+$doping course of the diode D1 is that of an epitaxial diode having the N$^+$zone as its substrate. In the diode having the thicker base, the N$^+$zone has a diffusion profile. The charge carrier distribution in the conducting phase has been calculated for a total conducting current of 50 A, 85% of which is carried by the partial diode D1 and 15% of which is carried by the partial diode D2. The area of D1 is 30 mm$^2$ and that of D2 is 4 mm$^2$. The conducting voltage was set to 2.0 V at room temperature. The requisite life in the base zone at high injection is 40 ns for the diode D1 and 850 ns for the diode D2. The effective base zone of the diode D2, which is flooded in the conducting state, has a thickness $W_2$, which is larger by a factor of 2.9 than that of the diode D1. As will be seen below, the storage charge of the diode D2 at the time of the maximum reverse current has been cleared out only to an extent of approximately ⅕($e\approx 0.2$). The variables shown in FIG. 5 were also used for the recovery performance (for 125° C.) shown in FIG. 3.

Figure 6:
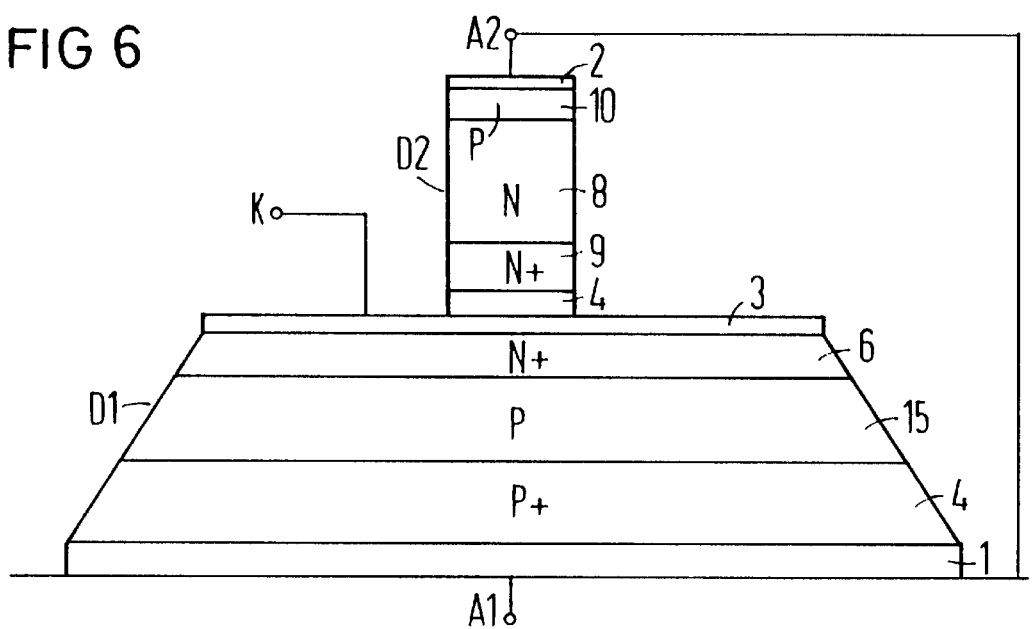
FIG. 6 is a diagrammatic, cross-sectional view showing one possible mechanical layout of a diode.

Alternatively to the embodiments described thus far, the inner zone of the partial diode D1 may be weakly p-conducting (FIG. 6), in which case there is a PP$^{31}$N$^+$ structure. The result is that the pn junction of the diode D1, which is now located between the inner zone 15 and the N$^+$region 6, is not cleared of charge carriers until later and takes on voltage later than in the case of the PNN$^+$structure. The diode D1 therefore has an especially hard recovery performance. However, when combined with the soft recovery diode D2 this is of no disadvantage. In diodes having an anode terminal that is at the same potential as the housing, such a structure can have advantages in terms of the mounting technique. The contact metal layer which faces toward the cathode in the diode chip D2 having the smaller area, can then be applied to the cathode metal layer of the diode chip D1, as FIG. 6 shows. This kind of mounting requires no additional space.

In a further feature of the invention, a leakage inductance $L_i$ can be incorporated between the metal layers or anode electrodes 1, 2 of the partial diodes. The partial diode D1 is joined directly to the anode contact A of the diode. Since the reverse current $i_{R2}$ of the partial diode D2 is still rising at the reverse current maximum of the entire diode (see FIG. 3), the full loop voltage $U_{R0}$ is not yet present at the diode D2 at this time, but instead only a voltage reduced by $L_i di_{R2}/dt$ is present. Consequently the storage charge $Q_{F2}$ is not yet cleared out as would correspond to the voltage $U_{R0}$ (reduction of e in equation 3)), so that the reverse current $i_{RM}$ is reduced. The leakage inductance can be achieved in practical terms by joining the anode electrode 2 of the partial diode D2 to the anode contact A of the entire diode only through a bonding wire to the anode electrode 1 of the partial diode D1. The bonding wire to the partial diode D1 and a leakage inductance caused thereby that precedes both partial diodes, is assigned not to the diode unit D but rather to the external circuit. Even a bonding wire that is 1 cm in length and 200 μm in thickness, having a leakage inductance $L_i$ that is 9.1 nH, leads to a notable improvement in the recovery performance of the diode unit.

In FIGS. 3 and 4, commutation processes are shown in which the back voltage $U_R$ does not rise as far as the breakdown region of the thinner partial diode. Unlike the situation in the known diodes, such a rise in the voltage up to the breakdown in the diode unit of the invention, does not lead to destruction or electromagnetic interference from high-frequency oscillation.

In FIG. 7, the current and voltage course of the two partial diodes and of the diode unit are shown for a commutation in which the voltage reaches the breakdown voltage $U_{B1}$ of the partial diode D1. As can be seen, at $U_{B1}=1100$ V, the voltage course changes sharply to a flat plateau. The reverse current $i_{R1}$ from the diode D1, which had already dropped to 0, rises again at this moment through avalanche generation. As a result, the decrease in the total reverse current $i_R=i_{R1}+i_{R2}$ is limited to the value that the available voltage difference at the inductance $L_e$ allows: $L_e di_R/dt = U_{B1}-U_{R0}$. Overall, a very satisfactory recovery performance can be observed. Through the use of the low thickness and doping of the base zone, the breakdown voltage of the diode D1 can now be made less than the voltage that leads to a breakdown at the surface. Without having to give up the soft recovery performance of the diode unit, the voltage through the diode unit itself is accordingly limited in such a way that no destruction occurs.

As FIG. 7 shows, high-frequency oscillation does not occur either. Such oscillation occurs in conventional diodes if a current break or interruption drives the voltage to the breakdown, thereby generating an avalanche current and causing the voltage to swing back because of the now reduced fraction di/dt, which then again leads to a current break or interruption because of the absence of avalanche generation, and so forth. In the diode unit of the invention, despite the avalanche generation in the partial diode D1, such oscillation does not occur, because the diode having the thick base still keeps enough residual charge ready at the limited voltage to prevent current breaks or interruptions from occurring.

Figure 8:
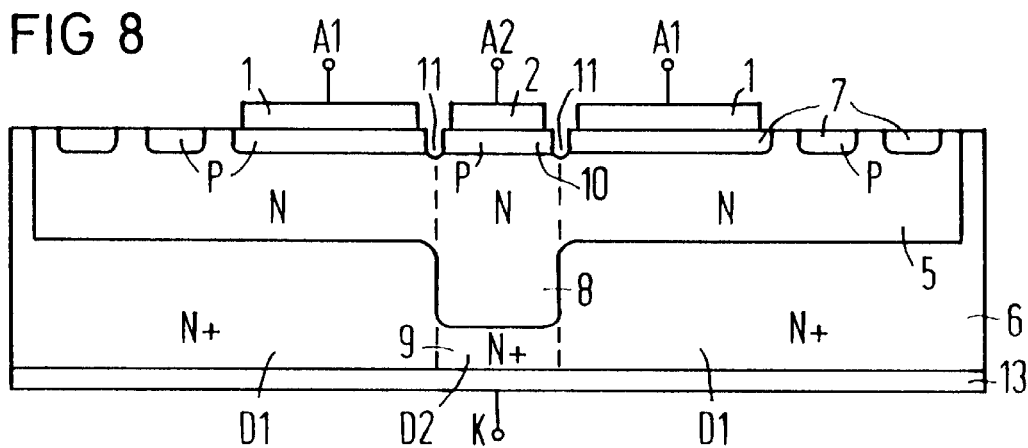
FIG. 8 is a cross-sectional view of a first exemplary embodiment.

An embodiment of the diode according to the invention, in which both partial diodes are integrated on one semiconductor chip, is shown in FIG. 8. The differing base thickness in the regions D1 and D2 in the embodiment shown is achieved by diffusing the N$^+$zone to various depths, while the thickness of the semiconductor body in both regions is the same. The anode electrodes 1, 2, like the adjoining semiconductor zones, may be interrupted between the partial diodes D1 and D2 by trenches 11, so that both regions can be separately provided with anode terminals. It is equally possible to separate the cathode electrodes. By way of example, the area of the partial diode D2 is 4 mm$^2$ and the area of the partial diode D1 is 25 mm$^2$.

Figure 9A:
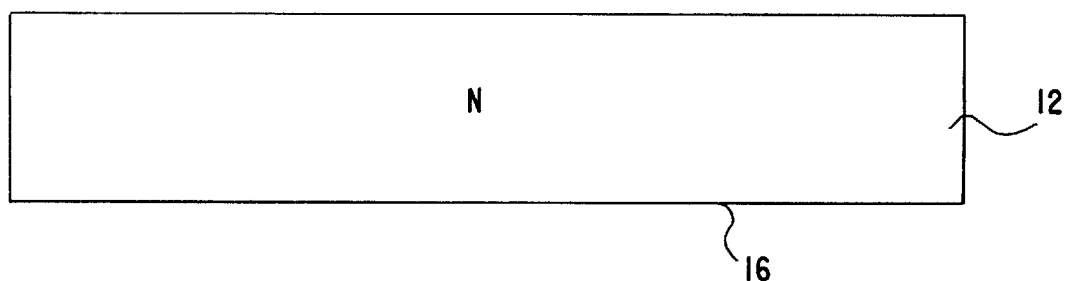
FIGS. 9a–9d are a series of cross-sectional views showing method steps for producing the exemplary embodiment of FIG. 8.
Figure 9B:
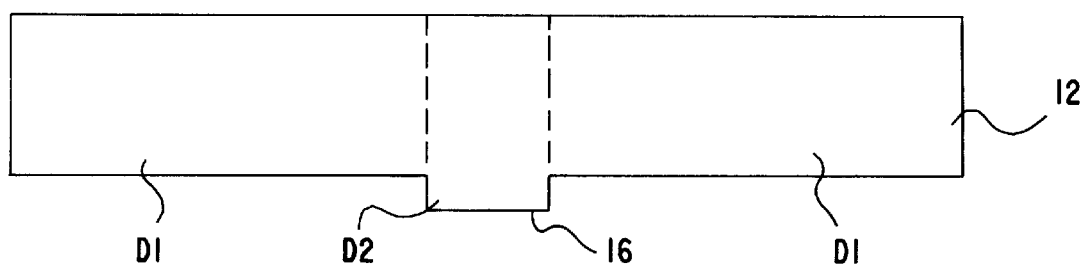
Figure 9C:
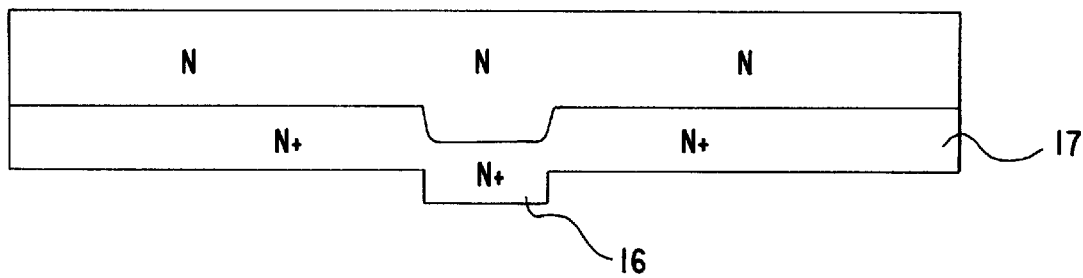
Figure 9D:
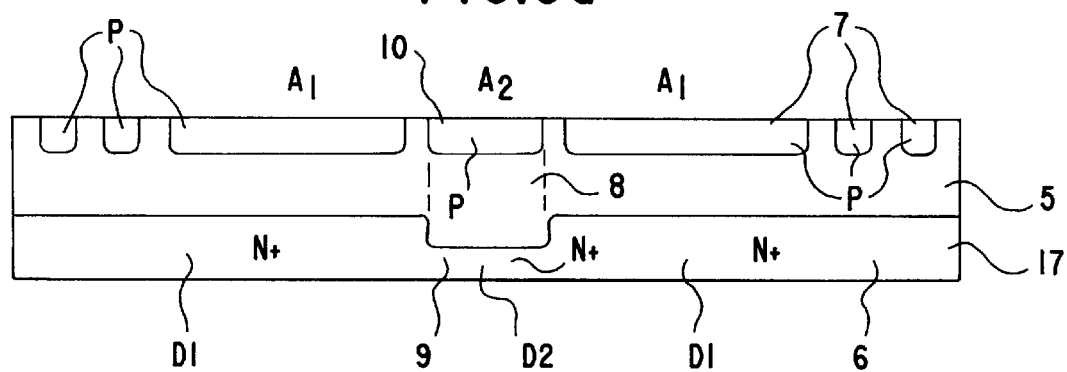

The production of a structure according to FIG. 8 is diagrammatically shown in FIGS. 9a–9d. A weakly n-conducting semiconductor body 12 shown in FIG. 9a is structured as is shown in FIG. 9b at its main surface 16 facing toward the cathode, for instance by etching into its thickness, so that variously thick regions are created for the partial diodes D1, D2. Next, an N+doped layer 17 is diffused-in from the main surface 16, as is shown in FIG. 9c. The semiconductor body is then smoothed by grinding, for instance, toward the cathode. Next, the zones 7, 10 toward the anode are diffused-in as is shown in FIG. 9d. The variable minority carrier life for the diodes D1 and D2 can be achieved by known methods, such as by shielding by electron irradiation or by laterally masked repair of the irradiation damage.

Figure 10:
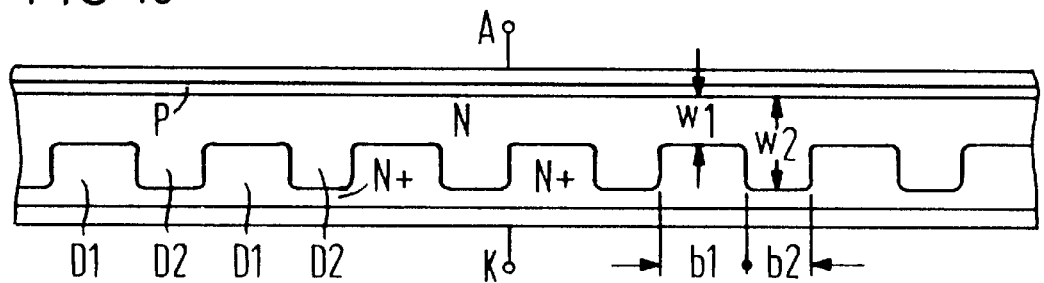
FIG. 10 is a cross-sectional view of another exemplary embodiment.

Another embodiment of the invention is shown in FIG. 10. In this case the regions of small and large base thickness $w_1$ and $w_2$, disposed in a semiconductor chip, have a slight lateral length. The diode unit includes a number of identical subunits each having a region of small and large base thickness. The subregions are preferably in strip form. The minority carrier life and doping concentration of the base zone are the same in the regions of small and large base thickness. A width b2 of the strips having the large base thickness $w_2$ is selected in such a way that the current from the vertically extending portions of the NN+junction makes up a substantial proportion of the total current in the regions having the large base thickness. To that end, the lateral width b2 of these strips is selected to be maximally equal to twice the amount of the additional base thickness: $b2 \leq 2(w_2-w_1)$. The width b1 of the strips having the lesser base thickness is of approximately equal magnitude to the width b2. For instance, $w_1=60$ μm, $w_2=120$ μm, and b1=b2=100 μm. Despite the equal life, in this way the charge that is still stored in the regions of large base thickness at the time of the peak reverse current can be brought to a magnitude that is comparable to the charge Qrs already extracted by that time. Since on the other hand the maximum reverse current, similarly to what has been described above, is reduced through the regions of lesser base thickness, better reverse recovery properties are obtained in this way than in the known diodes.

The invention is applicable not only to the exemplary embodiments described above but also wherever one of the diodes has already been integrated into a component. This is the case in power MOSFETs, for instance, in which an inverse diode is present that is polarized in the blocking direction with respect to the drain-to-source path polarized in the conducting direction. Such diodes are occasionally doped with recombination centers and may have a hard reverse recovery performance. If a diode has a thicker inner zone and an area connected parallel to the inverse diode in such a way that the aforementioned current distribution is established, then a soft recovery performance with a lesser reverse current peak results. It is also possible to use the invention in reverse-conducting thyristors, for instance, having an integrated diode that generally has soft recovery performance but a high reverse current peak. An external diode with a thinner inner zone can now be connected parallel to that diode. In comparison with the integrated diode, the external diode is dimensioned in view of the aspects discussed above and has a hard reverse recovery performance with a lesser reverse current peak.

We claim:

1. A power diode, comprising:
    at least one semiconductor body having a base zone of a first conductivity type and a given doping level, a cathode zone of the first conductivity type and a doping level higher than the given doping level, and an anode zone of a second conductivity type opposite the first conductivity type and a doping level higher than the given doping level;
    said base zone having at least a first region with a first predetermined thickness and being dimensioned for a given blocking voltage and a second region with a second thickness being greater than the first predetermined thickness by at least a factor of 1.4;
    the first region forming a base zone of a first diode and the second region forming a base zone of a second diode, said first diode having a first area and a first minority carrier lifetime, the second diode having a second area and a second minority carrier lifetime, said areas being dimensioned such that a forward current flowing through said first diode is greater than a forward current flowing through said second diode by at least a factor of 2.

2. The power diode according to claim 1, wherein said base zones of said two diodes have equal doping concentrations.

3. A power diode, comprising:
    at least one semiconductor body having a base zone of a first conductivity type and a given doping level, a cathode zone of the first conductivity type and a doping level higher than the given doping level, and an anode zone of a second conductivity type opposite the first conductivity type and a dosing level higher than the given doping level;
    said base zone having at least a first region with a first predetermined thickness and being dimensioned for a given blocking voltage and a second region with a second thickness being greater than the first predetermined thickness by at least a factor of 1.4;
    the first region forming a base zone of a first diode and the second region forming a base zone of a second diode, said first diode having a first area and a first minority carrier lifetime, the second diode having a second area and a second minority carrier lifetime. said areas being dimensioned such that a forward current flowing through said first diode is greater than a forward current flowing through said second diode by at least a factor of 2.

4. The power diode according to claim 1, wherein said second diode has a storage charge in a forward direction corresponding to from 0.5 to 2 times a storage charge of said first diode in the forward direction.

5. The power diode according to claim 1, wherein said diodes have equal storage charges in a forward direction.

6. The power diode according to claim 1, wherein said diodes have effective base thicknesses and wherein the forward currents of said diodes are approximately inversely proportional to the square of the effective base thicknesses.

7. The power diode according to claim 1, wherein said diodes have approximately equal forward current densities.

8. The power diode according to claim 1, wherein said first diode has an area of from 3 to 15 times greater than the area of said second diode.

9. The power diode according to claim 1, wherein said second region is approximately twice as thick as said first region.

10. The power diode according to claim 1, wherein said second diode has a forward current from one-fourth to one-eighth of a forward current flowing through said first diode.

11. The power diode according to claim 1, wherein said anode zone has first and second anode regions, said first and second diodes each include a respective one of said first and second anode regions, and said anode region of said second diode is less doped than said anode region of said first diode.

12. The power diode according to claim 1, wherein said diodes are integrated into said semiconductor body.

13. The power diode according to claim 1, wherein said at least one semiconductor body includes separate semiconductor bodies for said diodes, and said diodes have electrically interconnected cathode electrodes and electrically interconnected anode electrodes.

14. The power diode according to claim 13, including an inductance connected between said anode electrodes of said diodes.

* * * * *